(12) United States Patent
Chambers

(10) Patent No.: US 12,229,715 B2
(45) Date of Patent: Feb. 18, 2025

(54) ITEM INVENTORY MANAGEMENT APPARATUS, AND A SYSTEM AND METHOD OF MANUFACTURING THEREOF

(71) Applicant: Henchman Group Pty Ltd, Cardiff (AU)

(72) Inventor: Alisdair John Chambers, Cardiff (AU)

(73) Assignee: HENCHMAN GROUP PTY LTD, Cardiff (AU)

( * ) Notice: Subject to any disclaimer, the term of this patent is extended or adjusted under 35 U.S.C. 154(b) by 289 days.

(21) Appl. No.: 17/719,520

(22) Filed: Apr. 13, 2022

(65) Prior Publication Data

US 2022/0374825 A1    Nov. 24, 2022

(30) Foreign Application Priority Data

May 21, 2021 (AU) ................................ 2021901515

(51) Int. Cl.
| | |
|---|---|
| *G07C 9/00* | (2020.01) |
| *B25H 3/02* | (2006.01) |
| *G06K 9/00* | (2022.01) |
| *G06Q 10/087* | (2023.01) |
| *H05K 3/30* | (2006.01) |

(52) U.S. Cl.
CPC .......... *G06Q 10/087* (2013.01); *B25H 3/028* (2013.01); *H05K 3/301* (2013.01)

(58) Field of Classification Search
CPC ............................. G06Q 10/087; H05K 3/301
See application file for complete search history.

(56) References Cited

U.S. PATENT DOCUMENTS

| 8,020,768 | B2* | 9/2011 | Ramos-Elizondo ........................ |
| | | | G06Q 10/087 |
| | | | 235/487 |
| 8,159,345 | B2* | 4/2012 | Stevens ................ G06Q 10/087 |
| | | | 340/568.1 |
| 9,741,014 | B2* | 8/2017 | Rogers ................ G06Q 10/087 |
| 9,811,962 | B2* | 11/2017 | Phillips ................ G06F 3/0486 |

(Continued)

FOREIGN PATENT DOCUMENTS

| CN | 113044370 | 6/2021 | |
| GB | 2406092 A | * 3/2005 | ............. B25H 3/028 |

(Continued)

OTHER PUBLICATIONS

United Kingdom Intellectual Property Office, Search Report in GB2207320.9, dated Oct. 13, 2022, 2 pages.

*Primary Examiner* — Talia F Crawley
(74) *Attorney, Agent, or Firm* — RANKIN, HILL & CLARK LLP

(57) ABSTRACT

A method of manufacturing an item inventory apparatus including an item storage area and a plurality of sensors located within the item storage area may include the steps of: selecting one or more preconfigured boards, each of the one or more preconfigured boards having a plurality of predefined sensor placement locations, providing at least one storage material having a plurality of storage locations for a plurality of items, locating the plurality of sensors at least at some of the plurality of predefined sensor placement locations, and fitting the one or more preconfigured boards with the located plurality of sensors and the storage material to the item storage area. A related system and apparatus are also disclosed.

17 Claims, 8 Drawing Sheets

(56) References Cited

U.S. PATENT DOCUMENTS

| | | | | |
|---|---|---|---|---|
| 9,836,907 | B2* | 12/2017 | Phillips | B25H 3/00 |
| 10,013,834 | B2* | 7/2018 | Phillips | B25H 3/00 |
| 10,217,307 | B2* | 2/2019 | Phillips | G06V 20/52 |
| 10,347,066 | B2* | 7/2019 | Phillips | G06Q 10/087 |
| 10,384,869 | B1 | 8/2019 | Shiee | |
| 10,579,873 | B2* | 3/2020 | Lipsey | G06N 20/00 |
| 10,656,614 | B2* | 5/2020 | Londo | G05B 19/048 |
| 11,049,177 | B2* | 6/2021 | White | B25H 3/028 |
| 11,270,540 | B2* | 3/2022 | Phillips | G07C 9/23 |
| 2009/0072029 | A1* | 3/2009 | Martin | B25H 3/028 |
| | | | | 235/385 |
| 2011/0025503 | A1* | 2/2011 | Weaver | G08B 21/24 |
| | | | | 340/572.1 |
| 2012/0200385 | A1* | 8/2012 | Savage | G06Q 10/087 |
| | | | | 340/5.7 |
| 2013/0250117 | A1* | 9/2013 | Pixley | B25H 3/00 |
| | | | | 348/143 |
| 2013/0346261 | A1* | 12/2013 | Phillips | G07C 9/22 |
| | | | | 705/28 |
| 2017/0123399 | A1* | 5/2017 | Londo | G05B 19/048 |
| 2020/0093288 | A1* | 3/2020 | Sun | A47F 5/0018 |
| 2020/0158318 | A1* | 5/2020 | Paul | F21V 33/0012 |
| 2020/0202177 | A1* | 6/2020 | Buibas | G06V 10/764 |
| 2022/0222616 | A1* | 7/2022 | Harish | G06Q 10/087 |

FOREIGN PATENT DOCUMENTS

| | | |
|---|---|---|
| WO | 2009/024751 | 2/2009 |
| WO | 2010/017528 | 2/2010 |
| WO | 2014/189972 | 11/2014 |

* cited by examiner

ITEM INVENTORY MANAGEMENT APPARATUS, AND A SYSTEM AND METHOD OF MANUFACTURING THEREOF

RELATED APPLICATIONS

This application claims priority from Australian provisional patent application no. 2021901515 filed on 21 May 2021, the contents of which are incorporated by reference.

TECHNICAL FIELD

The invention relates to an apparatus for item inventory management, and a system and a method of manufacturing an item inventory management apparatus and parts thereof.

BACKGROUND

Apparatuses for item inventory management are used to store and automatically detect the presence or absence of the items such as tools. Some examples of such apparatuses may include a caddy with shelves in which the items are stored. Each of the shelves may include a foam cut out shaped to match the item and sensors arranged to detect the presence or absence of the item. The sensors are in communication with a computer system that may be configured to log the presence or absence of items.

Because each item may have a different shape and depth, the shelves are typically required to have a custom configuration for the item layout such as the shape of the foam cut out and the location of the sensors and supporting electronic components such as printed circuit boards.

A problem therefore arises during manufacturing because each shelf, in particular the sensors and related electronic components thereof, need to be custom designed and manufactured for each different layout. This custom design and manufacturing may be time consuming and costly.

The invention disclosed herein seeks to overcome one or more of the above identified problems or at least provide a useful alternative.

SUMMARY

In accordance with a first broad aspect there is provided, a method of manufacturing an item inventory apparatus including an item storage area and a plurality of sensors located within the item storage area. The method may include the steps of: selecting one or more preconfigured boards, each of the one or more preconfigured boards having a plurality of predefined sensor placement locations, each of the plurality of predefined sensor placement locations including placement indicia to indicate alternative lateral placement positions and associated connection apertures to electrically connect a connected one of the plurality of sensors to the selected one or more preconfigured boards.

The method may further include: providing at least one storage material having a plurality of storage locations for a plurality of items, each of the plurality of storage locations being shaped to store a specific one of the plurality of items;

The method may still further include: locating the plurality of sensors at least at some of the plurality of predefined sensor placement locations and adjusting, using the placement indicia and associated connection apertures, at least the lateral positions of the plurality of sensors such that the plurality of sensors are arranged to sense the specific ones of the plurality of items storable at the plurality of storage locations; and fitting the one or more preconfigured boards with the located plurality of sensors and the storage material to the item storage area.

In an aspect, the step of locating the plurality of sensors at least at some of the plurality of predefined sensor placement locations includes: adjusting a vertical position of each one of the plurality of sensors relative to the selected one of the one or more preconfigured boards.

In another aspect, the step of adjusting a vertical position of each one of the plurality of sensors relative to the selected one of the one or more pre-configured boards includes: spacing the sensor from the selected one of the one or more pre-configured boards.

In yet another aspect, the one or more preconfigured boards include two differently configured preconfigured boards.

In yet another aspect, the one or more preconfigured boards are usable in more than one orientation.

In yet another aspect, the one or more preconfigured boards are printed circuit boards.

In yet another aspect, the one or more preconfigured boards include a first and a second preconfigured board, wherein the first preconfigured board includes predefined sensor placement locations in which at least some of the predefined sensor placement locations are in a spaced apart diagonal arrangement, and wherein the second preconfigured board includes predefined sensor placement locations in which at least some of the predefined sensor placement locations are in a grid arrangement.

In yet another aspect, each of the plurality of sensors are at least one of a single part and a multipart.

In yet another aspect, each of the plurality of sensors includes or is fitted with a base.

In yet another aspect, each of the plurality of sensors includes or is fitted with a spacer.

In yet another aspect, the item inventory apparatus includes a plurality of item storage areas.

In yet another aspect, the item inventory apparatus includes a plurality of shelves or draws that each provide item storage areas suitable for tools.

In yet another aspect, the method includes forming cut outs within the storage material, each cut out being shaped to fittingly receive the corresponding specific one of the plurality of items.

In accordance with a second broad aspect there is provided, method of manufacturing an item inventory apparatus including an item storage area and a plurality of sensors located within the item storage area, the method may include the steps of: determining a layout of items for locating within the item storage area; forming an item storage insert having a plurality of storage locations to locate the layout of items, each of the plurality of storage locations being shaped to store a specific one of the plurality of items; selecting from a standardised range of boards, in which each board has predefined sensor placement locations including placement indicia to indicate alternative lateral placement positions and associated connection apertures, one or more boards in which the predefined sensor placement locations are most suitable for the determined layout of items; fitting, to the predefined sensor placement locations of the selected ones of the one or more boards, the plurality of sensors which are arrangeable relative to the placement indicia to sense corresponding ones of the plurality of items storable at the plurality of storage locations and connecting the fitted plurality of sensors with the associated connection apertures; and locating the selected ones of the one or more boards, the fitted plurality of sensors and the item storage insert within the item storage area with the storage insert located above the selected ones of the one or more boards.

In accordance with a third board aspect there is provided, an item inventory apparatus formed by a method as defined above and herein.

In accordance with a third board aspect there is provided, a system for manufacturing an item inventory apparatus including an item storage area and a plurality of sensors located within the item storage area, the system including: a standardised range of boards in which each board has predefined sensor placement locations, each of the plurality of predefined sensor placement locations including placement indicia to indicate alternative lateral placement positions and associated connection apertures to electrically connect a connected one of the plurality of sensors to a selected one or more of standardised range of boards; a standard range of sensors adapted to be electrically coupled to selected ones of the predefined sensor placement locations using the placement indicia and associated connection apertures; a storage material in which a plurality of shaped storage locations that locate a layout of items can be provided, wherein, in use, the storage material is formed with the plurality of shaped storage locations to provide the layout of items in which each of the shaped plurality of storage locations fits with a specific item, one or more of the standardised range of boards is selected with the predefined sensor placement locations that are most suitable for the layout of items, the plurality of sensors are laterally adjustable using the placement indicia and able to be electrically coupled to the associated connection apertures of selected ones of the predefined sensor placement locations to sense corresponding specific ones of items of the layout of items; and the selected or more of the standardised range of boards, the electrically coupled plurality of sensors and the storage material are fitted within the item storage area.

In accordance with a fourth board aspect there is provided, an apparatus for item inventory management, the apparatus including a storage area adapted to store a layout of items, the storage area including: a storage material defining shaped storage locations in which corresponding specific items of the layout of items are locatable, at least one board selected to best fit the layout of items from a range of standardised boards having predefined sensor placement locations; a plurality of sensors selected to best fit the layout of items from a range of standardised sensors, at least one of the plurality of sensors being provided for each of the specific items of the layout of items; wherein each of the predefined sensor placement locations includes placement indicia and corresponding electrical connections to allow lateral adjustment of each of the plurality of sensors and the plurality of sensors are adapted to provide vertical adjustment so as to allow variable and individual positioning of each of the plurality of sensors relative to each of the specific items located at the storage locations.

BRIEF DESCRIPTION OF THE FIGURES

The invention is described, by way of non-limiting example only, by reference to the accompanying figures, in which.

DETAILED DESCRIPTION

Figure 1:
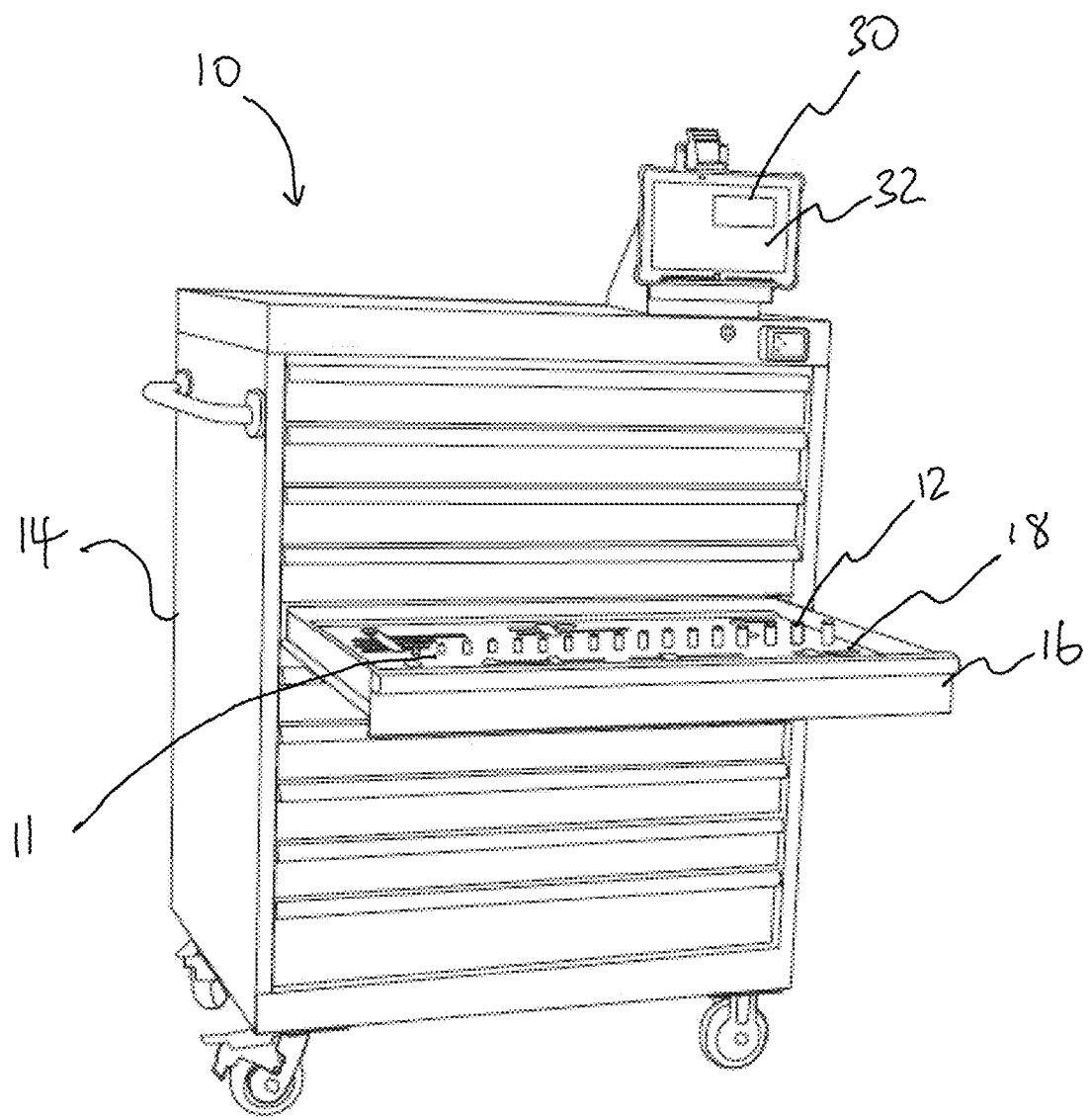
FIG. 1 is a perspective view illustrating an item management apparatus.
Figure 3:
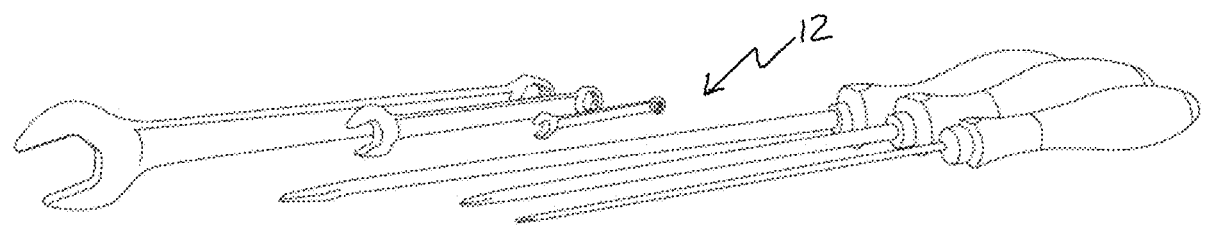
FIGS. 3 and 4 are perspective views illustrating examples of items in the form of tools that are storable in the item management apparatus.
Figure 4:
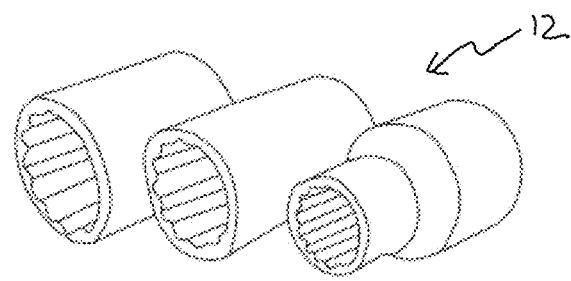

Referring to FIG. 1 there is shown an apparatus 10 for item inventory management and storage for a layout of items 11. The layout of items 11 may include, but are not limited to, tools or the like such as the tools 12 shown in FIGS. 2 to 4. The apparatus 10 may be in form of a caddy 14 as shown in FIG. 1 with moveable draws or shelves 16, also referred to as trays, or may be in other forms such as being wall or floor mounted open displays without draws or shelves 16.

The apparatus 10 includes one or more storage areas 18 adapted to store the layout of items 11. In this example, one of the storage areas 18 is provided in each of the draws or shelves 16 and includes storage material or insert 20 that has storage locations 22 shaped to located each of the tools 12. The storage material or insert 20 may be formed of foam cut to include shapes or other suitable material. Each of the storage locations 22 has a shape, including depth and length, to fit with different types of tools 12 such as those shown in FIGS. 3 and 4. As such, it may be appreciated that the position of the tools 12 may have, for example, varying depths within the storage locations 22 as well as varying lateral positions.

Figure 5:
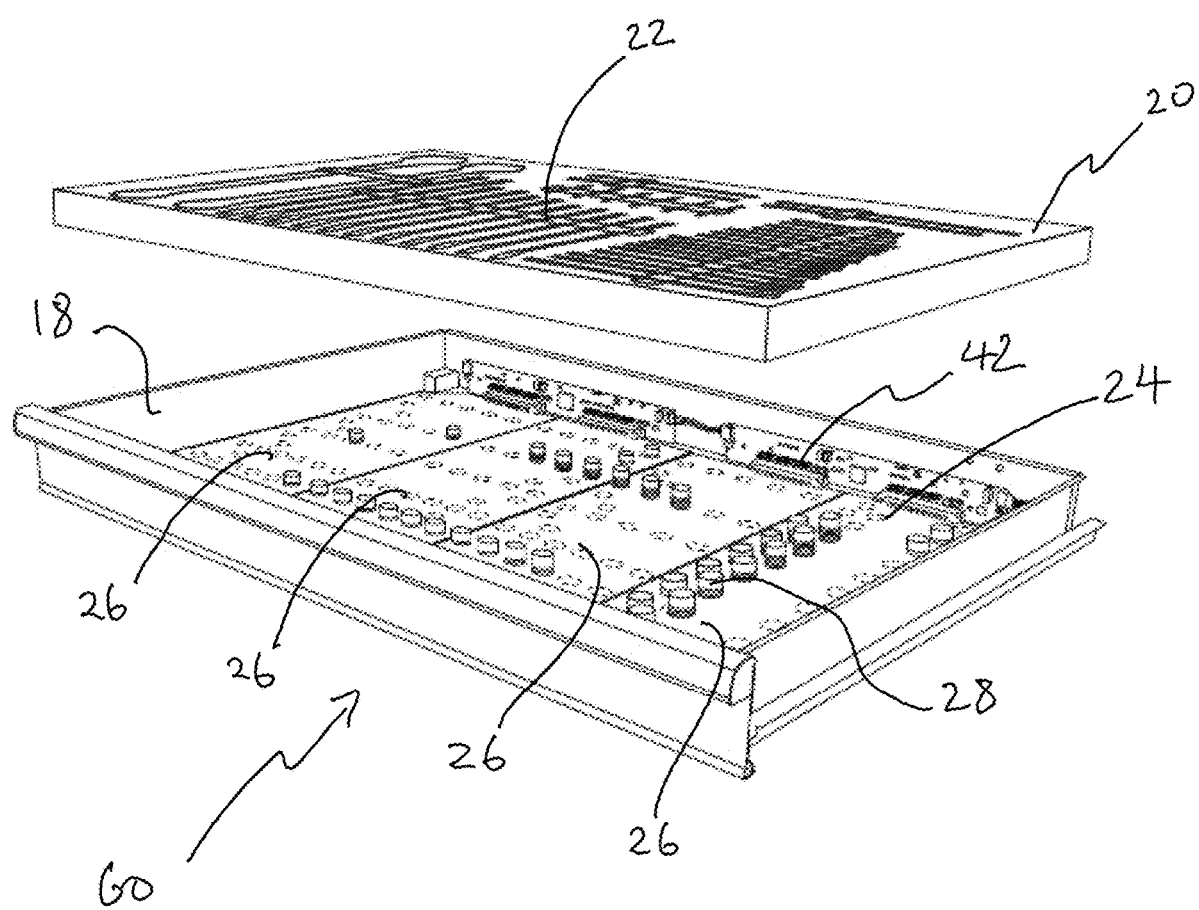
FIG. 5 is a front perspective view illustrating an example storage area in the form of the shelf or draw with the material elevated to reveal configurations of sensor board arrangements of the storage area.

Each of the storage locations 22 includes a sensor board arrangement 24, shown in FIG. 5, that includes one or more preconfigured or standardised boards 26 that are fitted with a plurality of sensors 28. The preconfigured boards 26 may be printed circuit boards and the plurality of sensors 28 may include proximity sensors such as eddy current or infrared type sensors. The arrangement of the sensors 28 is such that the presence or absence of the tool 12 is detectable. In some examples, between about 1 and 4, and preferable 2 or 3 preconfigured or standardised boards 26 may be required which are fitted adjacent one another and form a supporting base below the storage material or insert 20.

The apparatus 10 may include a computer system 30 in operable communication with each of the sensor board arrangement 24, and ultimately sensors 28 thereof, to provide an indication and log of item movements, more specifically tool movements, in and out of the storage area 18. For example, the tool 12 shown removed in FIG. 2 may be detected as being removed by its associated sensor 28 and a log of that event recorded by the computer system 30. In this example, the computer system 30 may include a screen 32 to provide a visual indication of the removal of the tool 12, and may include other information such as a time stamp, user number and tool number.

Figure 6:
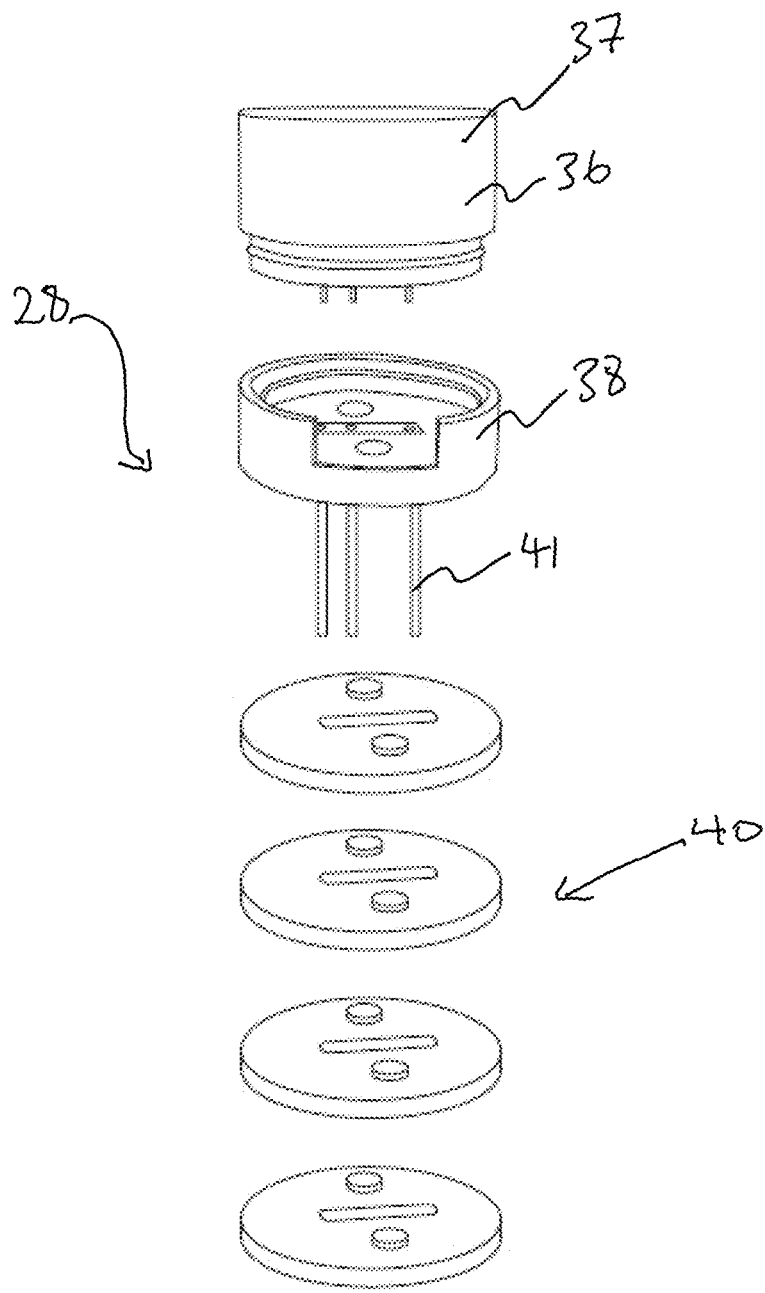
FIG. 6 is a perspective view illustrating an example of a sensor arrangement including a sensor, a base and a variety of removable spacers.

Turning now to the sensor board arrangement 24 in more detail, and referring more specifically to FIGS. 5 to 9h, the sensors 28, best shown in FIG. 6, are arranged to be electrically coupled to predefined sensor placement locations 34 of the boards 26 are best shown in FIGS. 7a to 8b. Each sensor 28 may include a sensor head 36 including a sensor element 37, such as an infrared or eddy current sensing element, a base 38 adapted to electrically connect with the predefined sensor placement locations 34 of the boards 26 and one or more spacers 40 that may be included to adjust the vertical location of the sensor element 37.

The sensor 28 may be formed as one part or may be provided as a multipart assembly as shown in this example, as this allows the height of the sensor 28 to be adjusted using a common set of parts. Further, the use of the base 38 allows the sensor head 36 to be remove or replaced, if need be, as the base 38 may remain connected to the board 26 and the head 36 may be removed or replaced. The legs 41 of the base 38 allow legs 41 of the base 38 to be secured in place prior to the sensor head 36 being fitted.

As is further described below, the sensors 28 are advantageously height adjustable and able to be fitted to any of the predefined sensor placement locations. This allows sensor 28 adjustment such as vertically to move the sensor head 36 closer to tools 12 such as small or thin tools that may be locate higher up or toward to top surface of the storage locations 22.

Figures 7A, 7B:
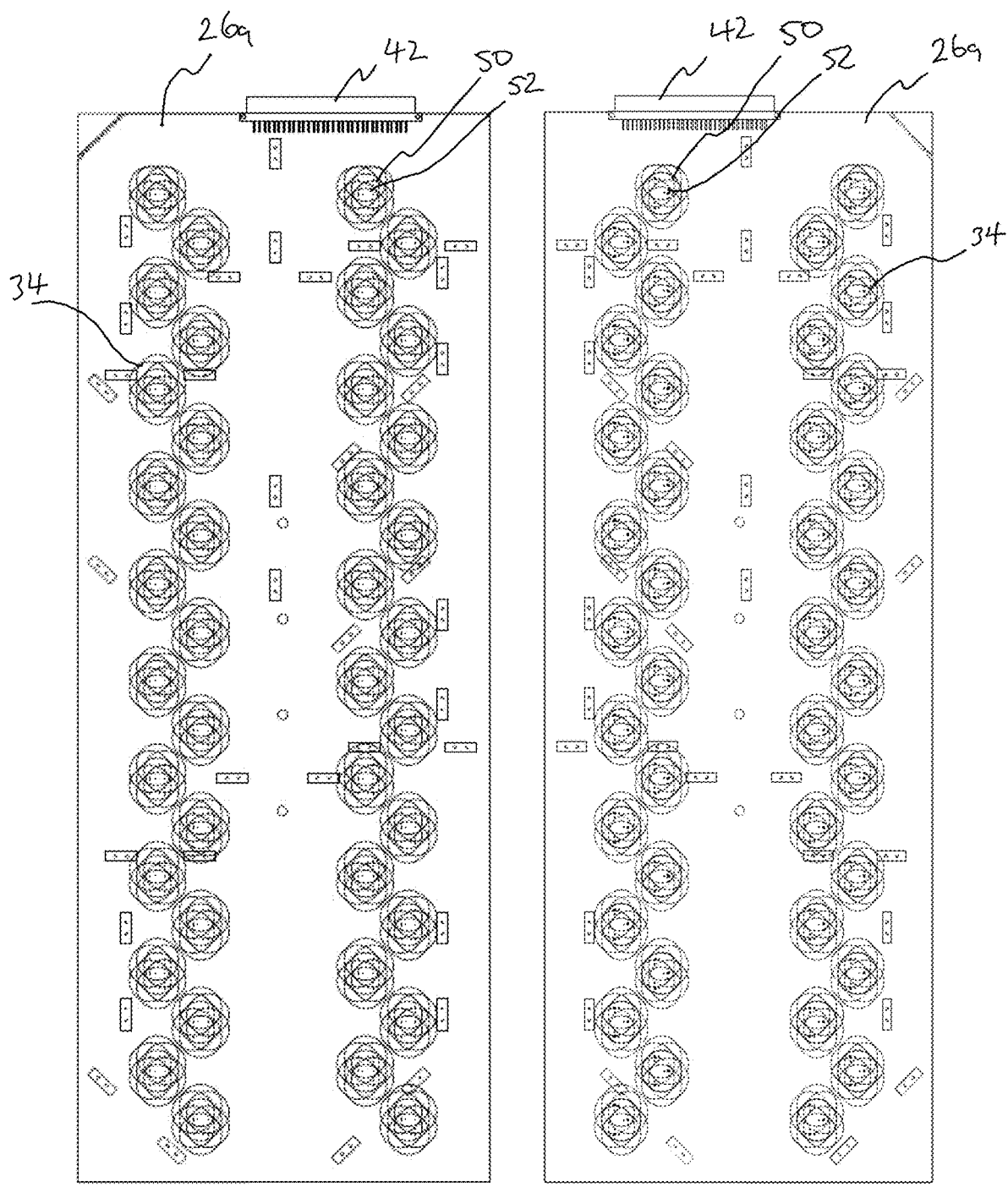
FIGS. 7*a* and 7*b* are respectively top and bottom views of a first type of standardised board of the item management apparatus.
Figure 8A:
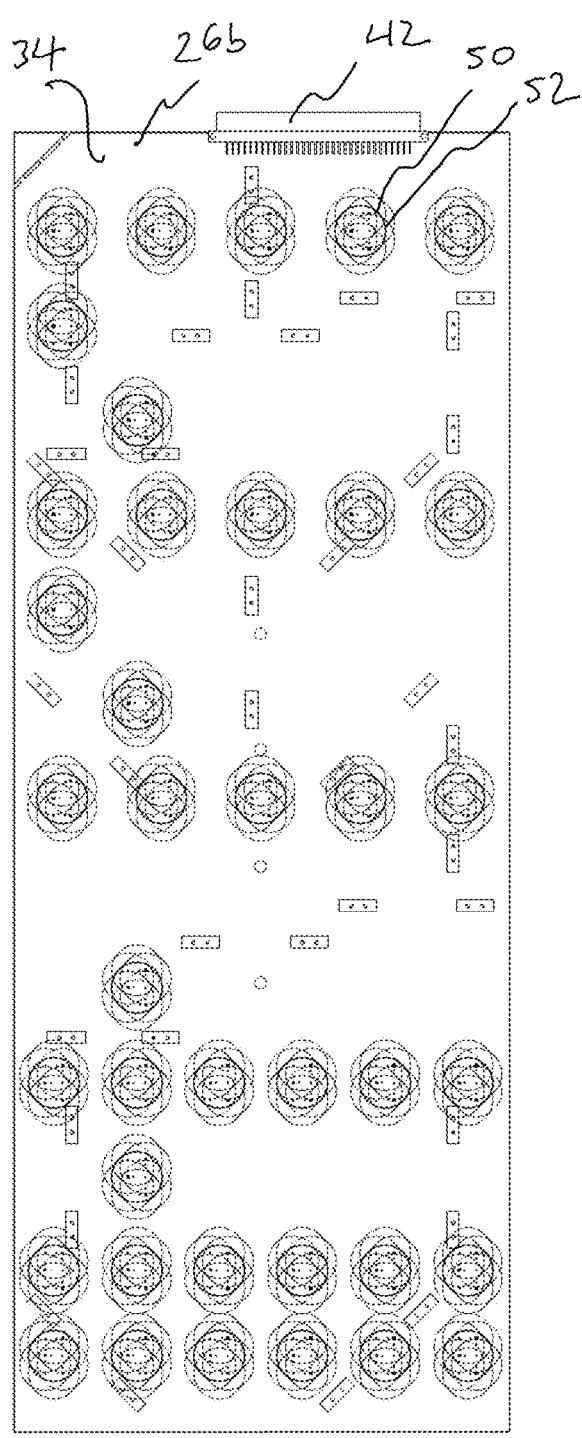
FIGS. 8*a* and 8*b* are respectively top and bottom views of a second type of standardised board of the item management apparatus.
Figure 8B:
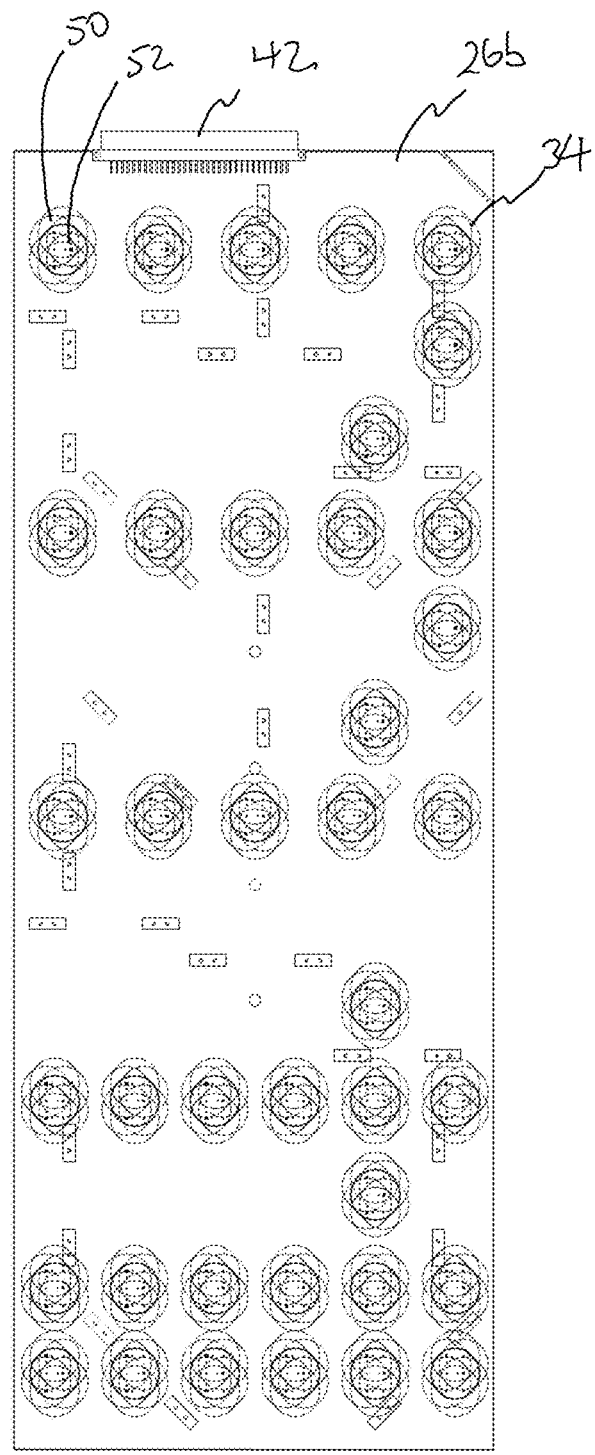

Referring to FIGS. 7a and 8b, the one or more preconfigured boards 26 may include a first type of preconfigured board 26a shown in FIGS. 7a and 7b and a second type of preconfigured board 26b as shown in FIGS. 8a and 8b that each include predefined sensor placement locations 34.

The first type of board 26a generally includes diagonal or zig-zag predefined sensor placement locations 34a and the second type of preconfigured board 26b includes a grid of predefined sensor placement locations 34b. Each of these boards 26a and 26b may be used from either side or upside down, and are interchangeable. Each of the predefined sensor placement locations 34 are preconnected by circuits to a socket outlet 42 that in turn communicates with the computer system 30. As such, once the sensor 28 is connected in position at one predefined sensor placement locations 34 it is electrically connected to the socket outlet 42 and a pin (not shown) thereof associated with the specific predefined sensor placement location 34.

Figure 9A:
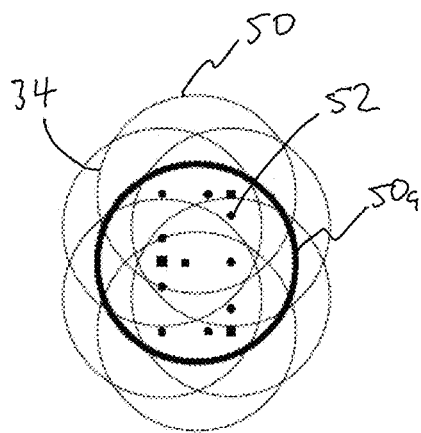
FIG. 9*a* is a top view illustrating an example one of a sensor placement locator indicia of one of the standardised boards.
Figure 9B:
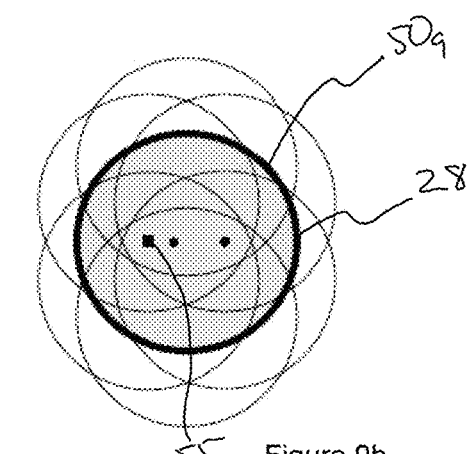
FIGS. 9*b* to 9*h* illustrate combinations of lateral and longitudinal adjustment of the sensor relative to the sensor placement locator.
Figure 9C:
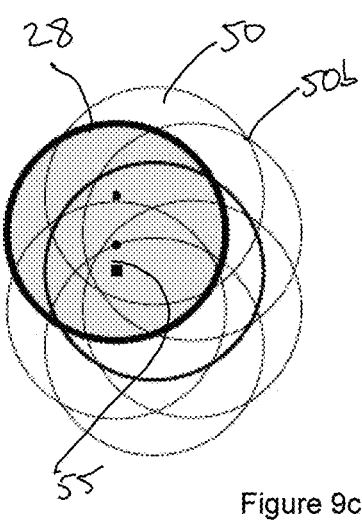
Figure 9D:
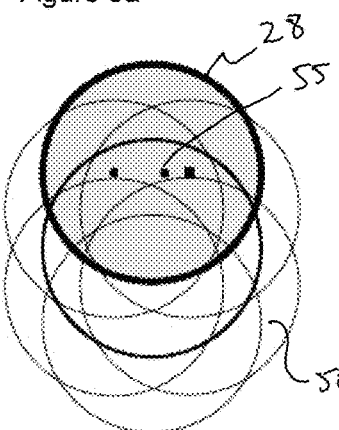
Figure 9E:
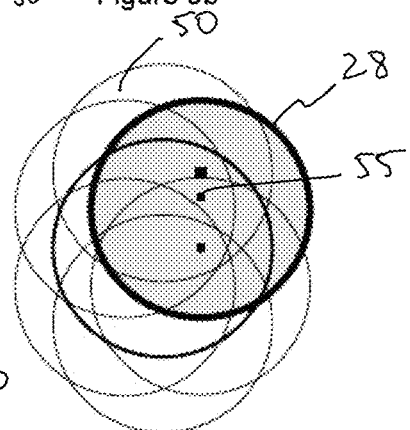
Figure 9F:
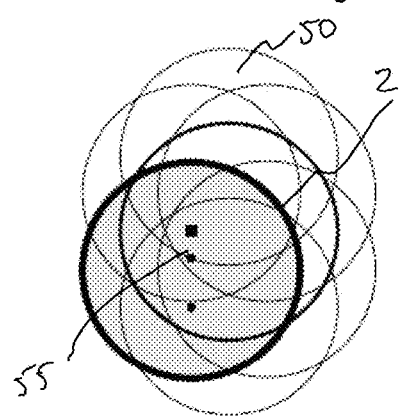
Figure 9G:
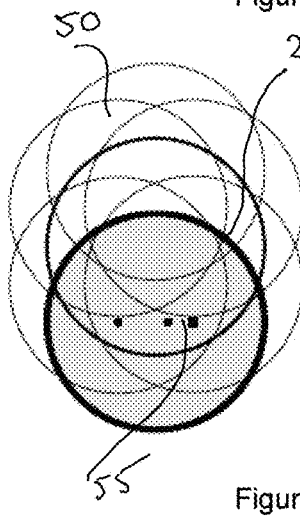
Figure 9H:
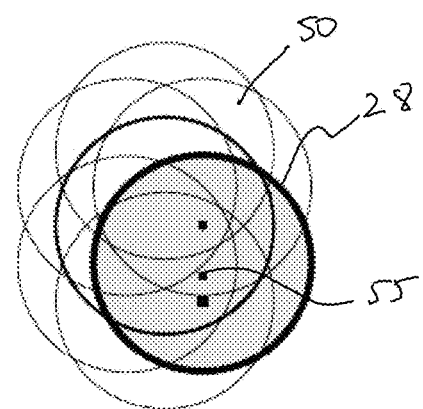

Each of the types of boards, 26a, 26b, include the predefined sensor placement locations 34 which as best shown in FIG. 9a include a plurality of predetermined fit position indica or markings 50 and connection apertures 52. The predetermined fit position indica 50 indicate a central position 50a as shown in FIG. 9b and further lateral positions 50b including, for example, north west, north, north east, south west, south and south west as shown in FIGS. 9c to FIG. 9h, respectively. This allows the sensor 28 to be moved laterally to make adjustments, typically smaller adjustments, to better position the sensors 28 relative to the storage locations 22 and each of the tools 12. Accordingly, the choice of boards 26a, 26b and the predefined sensor placement locations 34 provide for macro adjustment of the sensors 28 and the predetermined fit position indica 50 at each of the predefined sensor placement locations 34 provides for micro or finer adjustment.

The connection apertures 52 may be configured, such as in this example, to have a square pin as part of a three-pin connection 55, to allow the sensor 28 to be fitted in a preferred orientation only. As shown in FIGS. 9b to 9h, the three-pin connection 55 to be used varies in its location and orientation depending on which lateral position is selected for the sensors 28.

The predetermined fit position indica 50 are shown as circles, however, other forms of indicia or marking may be provided such as lines, crosses or the like. In this example only two of the preconfigured standardised range of boards 26 have been shown and it has been found that most layouts can be accommodated with only two boards. However, it is noted that further boards, such as a third standardised board, could be included in some examples, and in other examples only a single standardised board may be required.

The preconfigured standardised range of boards 26, the standard range of sensors 28 and the storage material 20 may be used as system 60 of stock or standardised parts for manufacturing the item inventory apparatus 10, in particular, forming the storage areas 18 thereof, as is further described in the method below.

Figure 2:
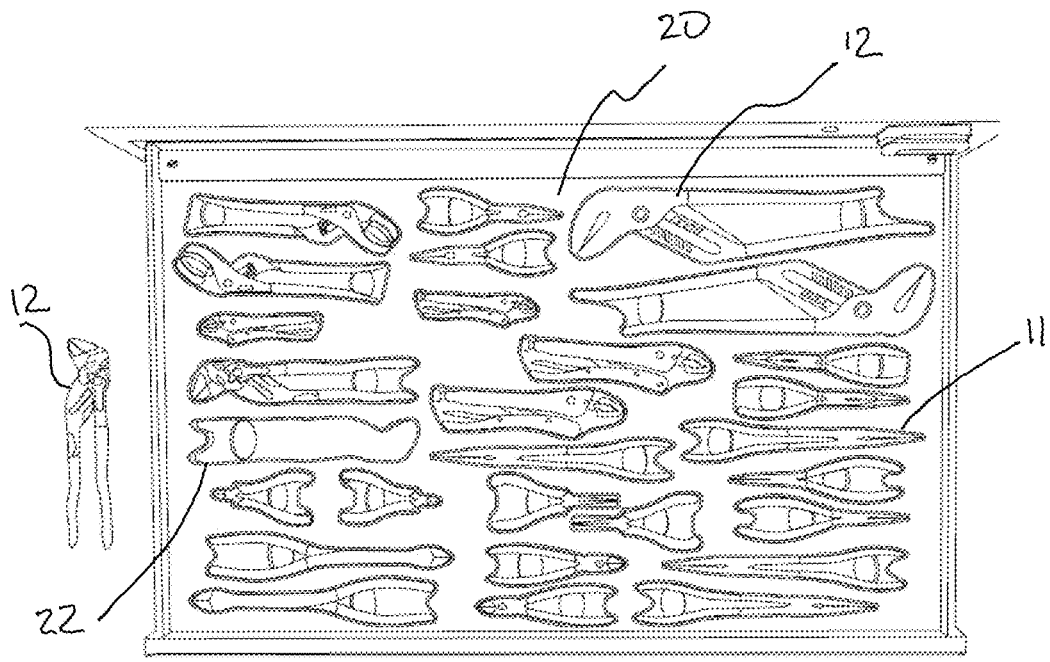
FIG. 2 is a top view illustrating a storage area of the item management apparatus showing a material with item storage locations and one of the items removed.
Figure 10:
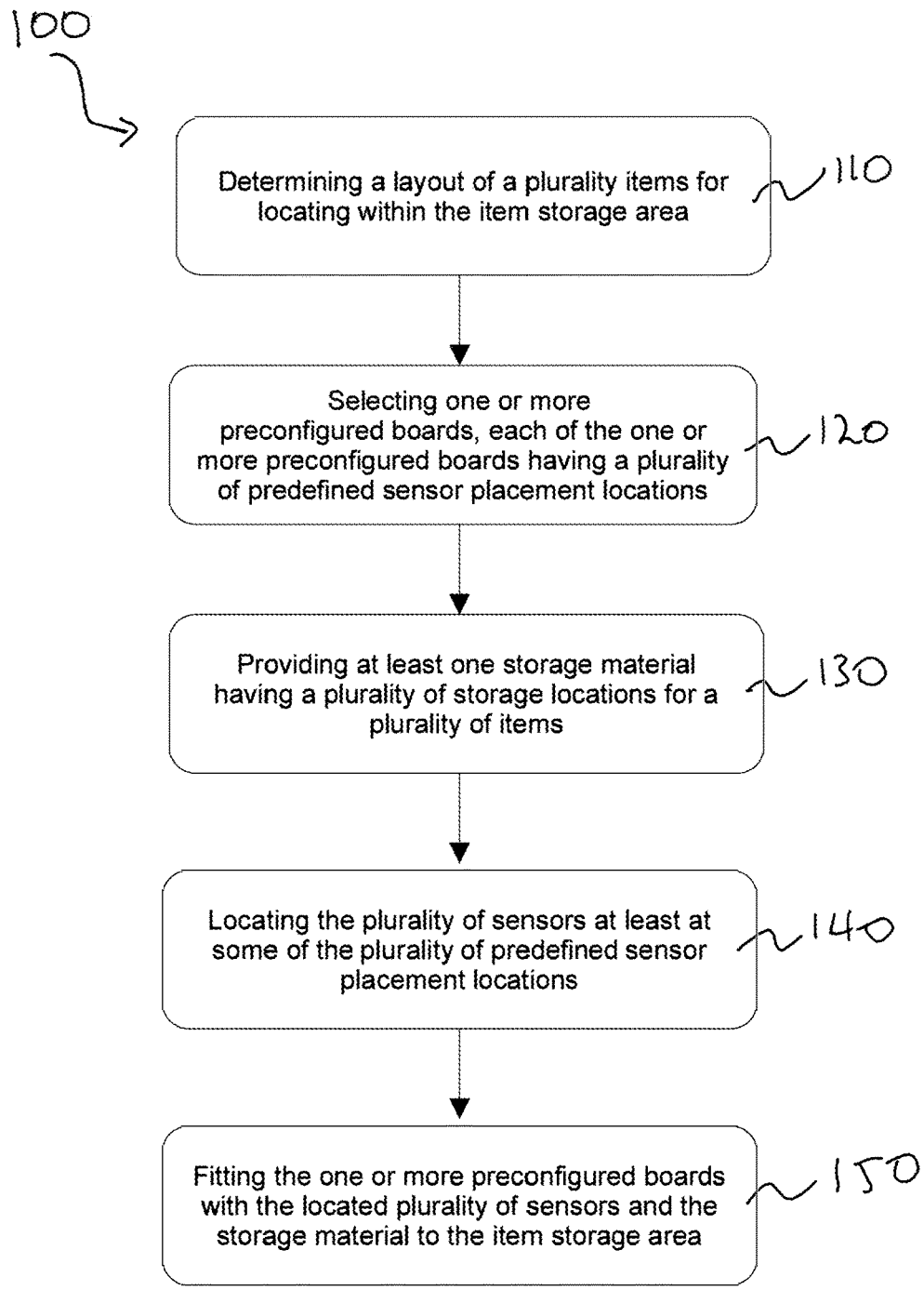
FIG. 10 is a flow diagram illustrating an example method of manufacturing the item for inventory management and storage.

Turning now to a method 100 of manufacturing the item inventory apparatus 10 and referring to FIG. 10, the method includes, typically for each storage area 18, at step 110, determining a layout of items for locating within the item storage area 18. For example, the stowage area 18 may be configured to store items in the form of tools 12 as shown in FIG. 2.

Once the layout of items is determined, at step 120 one or more the boards 26 may be selected from the stock or standardised range of boards such as boards 26a and 26b as shown in FIGS. 7a to 8b. The selection may be based on which of the boards 26 has the better or most suitable predefined sensor placement locations 34 for the layout of items. At step 130, the item storage insert or material 20 may then be formed, such as but cutting or routing, with a plurality of storage locations 22 to locate the layout of items 11. Accordingly, each specific tool may have a specifically shaped storage location 22 in which it is fittingly received when stowed.

Next, at step 140 the plurality of sensors 28 may be located and fitted to selected ones of the predefined sensor placement locations 34 that fit best the layout of items 11. The plurality of sensors 28 are individually fitted to respective predefined sensor placement locations 34 and may be laterally adjusted in any of the directions as shown in FIGS. 9c to 9h. Further, the sensors 28 may be adjusted in height such as by fitting or removing spacers 40 to ensure the sensor head 36 is positioned to sense the corresponding ones of the plurality of items 11 storable at the plurality of storage locations 22. The bases 38 of the sensors 28 may be secured, more specifically soldered in place, and the spacers 40 and sensor head 36 may be fitted thereto.

At step 150, once the sensor board arrangements 24 are configured, the selected boards 26 and fitted sensors 26 may be located within the item storage area 18, and the socket outlet 42 of each of boards 26 may be connected with corresponding connector (not shown) within the item storage area 18 to provide communication with the computer system 30. The item storage material 20 is then place generally on top or around of the sensor board arrangements 24 and the items, such as tools 12, may be located in the storage locations 22. Of course, the complete manufacture of the item inventory apparatus 10 would also include, in this example, fabrication of the caddy 14, its draws and other structural components. The computer system 30 would also need to be fitted, electrically connected and configured to function with the fitted sensor board arrangements 24.

Advantageously, the standardised preconfigured boards and the standardised sensors, allow standardised parts to be premanufactured and kept in stock before it is known what the layout of items may be. These premanufactured boards and sensors can then be configured to a variety layouts using the adjustment of the positions of the sensors to allow tools at a consistent height in a foam tool material that are neatly and evenly spread out.

As such, bespoke boards or sensors do not need to be manufactured for each new layout which reduces both the time and cost of manufacturing because the premanufactured boards and sensors can be used. Further, the height adjustability of the sensor allows the sensors to be positioned for better sensing of the item, which is particularly advantageous for thin tools, and the plug-in base of the sensor allows ease of maintenance of the sensor head.

Furthermore still, the boards form the base of the shelves or trays on which the storage material or inserts are supported, are adaptive without needing wires or wiring changes, and allow the sensors to be moved at a later time such as updating the tool layout and/or for the sensors to be replaced.

Throughout this specification and the claims which follow, unless the context requires otherwise, the word "comprise", and variations such as "comprises" and "comprising", will be understood to imply the inclusion of a stated integer or step or group of integers or steps but not the exclusion of any other integer or step or group of integers or steps.

The reference in this specification to any known matter or any prior publication is not, and should not be taken to be, an acknowledgment or admission or suggestion that the known matter or prior art publication forms part of the common general knowledge in the field to which this specification relates.

While specific examples of the invention have been described, it will be understood that the invention extends to alternative combinations of the features disclosed or evident from the disclosure provided herein.

Many and various modifications will be apparent to those skilled in the art without departing from the scope of the invention disclosed or evident from the disclosure provided herein.

The claims defining the Invention are as follows:

1. A method of manufacturing an item inventory apparatus including an item storage area and a plurality of sensors located within the item storage area, the method comprising:
   selecting one or more preconfigured printed circuit boards, each of the one or more preconfigured printed circuit boards having a plurality of predefined sensor placement locations allowing for selective movement of the plurality of sensors relative to the selected one or more preconfigured printed circuit boards, each of the plurality of predefined sensor placement locations including placement indicia to indicate alternative lateral placement positions and associated connection apertures to electrically connect a connected one of the plurality of sensors to the selected one or more preconfigured printed circuit boards;
   providing at least one storage material having a plurality of storage locations for a plurality of items, each of the plurality of storage locations being shaped to store a specific one of the plurality of items;
   locating the plurality of sensors at least at some of the plurality of predefined sensor placement locations and adjusting, using the placement indicia and associated connection apertures, at least the lateral positions of the plurality of sensors such that the plurality of sensors are arranged to sense the specific ones of the plurality of items storable at the plurality of storage locations; and
   fitting the one or more preconfigured printed circuit boards with the located plurality of sensors and the storage material to the item storage area,
   wherein the one or more preconfigured printed circuit boards extend below the storage material with the located plurality of sensors being aligned with respective ones of the plurality of storage locations of the storage material.

2. The method according to claim 1, wherein locating the plurality of sensors at least at some of the plurality of predefined sensor placement locations includes:
   adjusting a vertical position of each one of the plurality of sensors relative to the selected one of the one or more preconfigured printed circuit boards.

3. The method according to claim 2, wherein adjusting a vertical position of each one of the plurality of sensors relative to the selected one of the one or more pre-configured printed circuit boards includes: spacing the sensor from the selected one of the one or more pre-configured printed circuit boards.

4. The method according to claim 1, wherein the one or more preconfigured boards include two differently configured preconfigured printed circuit boards.

5. The method according to claim 1, wherein the one or more preconfigured printed circuit boards are usable in more than one orientation.

6. The method according to claim 1, wherein the one or more preconfigured printed circuit boards include a first and a second preconfigured printed circuit board, wherein the first preconfigured printed circuit board includes predefined sensor placement locations in which at least some of the predefined sensor placement locations are in a spaced apart diagonal arrangement, and wherein the second preconfigured printed circuit board includes predefined sensor placement locations in which at least some of the predefined sensor placement locations are in a grid arrangement.

7. The method according to claim 1, wherein each of the plurality of sensors are at least one of a single part and a multipart.

8. The method according to claim 1, wherein each of the plurality of sensors includes or is fitted with a base.

9. The method according to claim 1, wherein each of the plurality of sensors includes or is fitted with a spacer.

10. The method according to claim 1, wherein the item inventory apparatus includes a plurality of item storage areas.

11. The method according to claim 1, wherein the item inventory apparatus includes a plurality of shelves or draws that each provide item storage areas suitable for tools.

12. The method according to claim 1, wherein the method includes forming cut outs within the storage material, each cut out being shaped to fittingly receive the corresponding specific one of the plurality of items.

13. A system for manufacturing an item inventory apparatus including an item storage area and a plurality of sensors located within the item storage area, the system including:
   a standardised range of printed circuit boards in which each printed circuit board has predefined sensor placement locations allowing for selective movement of the plurality of sensors relative to a selected one or more of the standardised printed circuit boards, each of the plurality of predefined sensor placement locations including placement indicia to indicate alternative lateral placement positions and associated connection apertures to electrically connect a connected one of the plurality of sensors to the selected one or more of the standardised range of printed circuit boards;

a standard range of sensors adapted to be electrically coupled to selected ones of the predefined sensor placement locations using the placement indicia and associated connection apertures;

a storage material in which a plurality of shaped storage locations that locate a layout of items can be provided, wherein, in use, the storage material is formed with the plurality of shaped storage locations to provide the layout of items in which each of the shaped plurality of storage locations fits with a specific item, one or more of the standardised range of printed circuit boards is selected with the predefined sensor placement locations that are most suitable for the layout of items, the plurality of sensors are laterally adjustable using the placement indica and able to be electrically coupled to the associated connection apertures of selected ones of the predefined sensor placement locations to sense corresponding specific ones of items of the layout of items; and the selected one or more of the standardised range of printed circuit boards, the electrically coupled plurality of sensors and the storage material are fitted within the item storage area, wherein the selected one or more of the standardised range of printed circuit boards extend below the storage material with the located plurality of sensors being aligned with respective ones of the plurality of storage locations of the storage material.

14. An apparatus for item inventory management, the apparatus including a storage area adapted to store a layout of items, the storage area including:

a storage material defining shaped storage locations in which corresponding specific items of the layout of items are locatable, at least one printed circuit board selected to best fit the layout of items from a range of standardised printed circuit boards having predefined sensor placement locations;

a plurality of sensors adapted to electrically connected to the at least one printed circuit board, the plurality of sensors selected to best fit the layout of items from a range of standardised sensors, the plurality of sensors movable relative to the at least one printed circuit board, at least one of the plurality of sensors being provided for each of the specific items of the layout of items;

wherein each of the predefined sensor placement locations includes placement indicia and corresponding electrical connections to allow lateral adjustment of each of the plurality of sensors and the plurality of sensors are adapted to provide vertical adjustment so as to allow variable and individual positioning of each of the plurality of sensors relative to each of the specific items located at the storage locations, and wherein the at least one printed circuit board and the plurality of sensors electrically connected thereto are arranged to extend below storage material with a position of the least one of the plurality of sensors corresponding to a location of the shaped storage locations of the storage material.

15. The method according to claim 1, wherein the one or more preconfigured printed circuit form a planar base below the storage material.

16. The system according to claim 13, wherein the selected one or more of the standardised range of printed circuit boards form a planar base below the storage material.

17. The apparatus according to claim 14, wherein the at least one printed circuit board forms a planar base below the storage material.

* * * * *